United States Patent
Braganca et al.

(10) Patent No.: US 8,654,465 B2
(45) Date of Patent: *Feb. 18, 2014

(54) IMPLEMENTING SPIN-TORQUE OSCILLATOR SENSING WITH ENHANCED DEMODULATOR FOR HARD DISK DRIVES

(75) Inventors: Patrick Mesquita Braganca, San Jose, CA (US); Richard Leo Galbraith, Rochester, MN (US); Bruce Alvin Gurney, San Jose, CA (US); Neil Smith, San Jose, CA (US); Bruce Wilson, San Jose, CA (US); Rehan Ahmed Zakai, San Ramon, CA (US)

(73) Assignee: HGST Netherlands B.V., Amsterdam (NL)

( * ) Notice: Subject to any disclaimer, the term of this patent is extended or adjusted under 35 U.S.C. 154(b) by 143 days.

This patent is subject to a terminal disclaimer.

(21) Appl. No.: 13/316,342

(22) Filed: Dec. 9, 2011

(65) Prior Publication Data

US 2013/0148223 A1 Jun. 13, 2013

(51) Int. Cl.
*G11B 20/06* (2006.01)
*G11B 5/02* (2006.01)

(52) U.S. Cl.
USPC .............................. 360/30; 360/55

(58) Field of Classification Search
None
See application file for complete search history.

(56) References Cited

U.S. PATENT DOCUMENTS

| 6,566,872 | B1 | 5/2003 | Sugitani |
| 7,471,491 | B2 | 12/2008 | Sato et al. |
| 2006/0221507 | A1 | 10/2006 | Sato et al. |
| 2008/0080100 | A1 | 4/2008 | Sato et al. |
| 2009/0201614 | A1 | 8/2009 | Kudo et al. |
| 2013/0107395 | A1* | 5/2013 | Nagasawa et al. ............... 360/75 |

OTHER PUBLICATIONS

"A Wideband FM Demodulator for a Low-Complexity FM-UWB Receiver" by John F.M. Gerrits et al., Proceedings of the 9th European Conference on Wireless Technology, Sep. 2006, pp. 99-102.
"Signal-to-noise ratios in high-signal-transfer-rate read heads composed of spin-torque oscillators" by K. Mizushima et al., Journal of Applied Physics 107, 063904 (2010).
"Nanoscale magnetic field detection using a spin torque oscillator" by P M Braganca et al. Nanotechnology 21 (2010) 235202 (6pp).
"Frequency transition of spin-torque oscillator under the magnetic-field pulse in nanosecond range" by Tazumi Nagasawa et al., Journal of Applied Physics 109, 07C907 (2011).
"Real-Time Measurement of Temporal Response of a Spin-Torque Oscillator to Magnetic Pulses" by Hirofumi Suto et al., Applied Physics Express 4 (2011) 013003, pp. 1-3.
"Numerical Simulation on Temporal Response of Spin-Torque Oscillator to Magnetic Pulses" by Kiwamu Kudo et al., Applied Physics Express 3 (2010) 0043002, pp. 1-3.
"Amplitude-phase coupling in a spin-torque nano-oscillator" by Kiwamu Kudo et al., Journal of Applied Physics 105, 07D105 (2009).
"Numerical Simulation on Temporal Response of Spin-Torque Oscillator to Magnetic Pulses" by Kiwamu Kudo et al., Applied Physics Express 4 (2010) 043002, pp. 1-3.

* cited by examiner

*Primary Examiner* — Regina N Holder
(74) *Attorney, Agent, or Firm* — Joan Pennington

(57) ABSTRACT

A method, apparatus, and system are provided for implementing spin-torque oscillator (STO) sensing with a demodulator for hard disk drives. The demodulator measures an instantaneous phase of the readback signal from a STO sensor and converts the readback signal into a signal that is proportional to the magnetic field affecting the STO frequency during a bit time. The converted signal is used for processing by conventional data detection electronics.

14 Claims, 4 Drawing Sheets

IMPLEMENTING SPIN-TORQUE OSCILLATOR SENSING WITH ENHANCED DEMODULATOR FOR HARD DISK DRIVES

RELATED APPLICATIONS

Related applications by the present inventors and present assignee are being filed on the same day herewith including:

Ser. No. 13/316,407, entitled "IMPLEMENTING SPIN-TORQUE OSCILLATOR SENSING WITH ENHANCED DELAY CONTROL FEEDBACK CIRCUIT FOR HARD DISK DRIVES"; and Ser. No. 13/316,419, entitled "IMPLEMENTING SPIN-TORQUE OSCILLATOR SENSING WITH ENHANCED INTEGRATED DEMODULATOR FOR HARD DISK DRIVES".

FIELD OF THE INVENTION

The present invention relates generally to the data storage field, and more particularly, relates to a method, apparatus, and system for implementing spin-torque oscillator sensing with a demodulator for hard disk drives.

DESCRIPTION OF THE RELATED ART

In hard disk drives (HDDs) magnetoresistive (MR) sensors typically are used including giant magnetoresistive (GMR) and tunneling magnetoresistive (TMR) sensors to sense magnetic patterns of data recorded on a writable disk surface.

TMR sensors detect the magnetic field strength changes ($\Delta H$) experienced by the magnetic sensor while passing over magnetically written bits on the spinning magnetic disk media, and directly convert the detected $\Delta H$ to an electrical signal with a time-varying voltage level ($\Delta V$), which can be converted into data bits by the read channel electronics.

However, as today's sensors trend towards smaller dimensions to accommodate higher media areal densities in magnetic recording, magnetic noise resulting from thermally actuated fluctuations of the ferromagnetic layers will decrease the signal to noise ratio (SNR) to the point at which the sensor may no longer achieve sufficient error rate.

A need exists for a sensor technology that can be scaled to dimensions below 30 nm in order to detect a magnetic field with extremely high spatial resolution. One possible sensor for nanoscale sensing measures magnetic field strength by operating a magnetoresistive device as a spin torque oscillator (STO) and detecting changes in the oscillator's frequency ($\Delta f$).

For example, signal processing benefits arising from a changeover to frequency modulation (FM) detection of STOs for magnetic field sensing applications, and STO design considerations for maximizing sensor performance are described by Braganca P M, Gurney B A, Wilson B A, Katine J A, Matt S, and Childress J R, "Nanoscale magnetic field detection using a spin torque oscillator," Nanotechnology 21 (2010) 235202 (6pp); online at stacks.iop.org/Nano/21/235202.

Spin-Torque Oscillator (STO) sensors, in contrast to TMR sensors, include two stages, a first stage that converts $\Delta H$ to $\Delta f$ by using a STO that is designed to have a large $\Delta f/\Delta H$, and a second stage using detector electronics that converts $\Delta f$ to the time-varying voltage level ($\Delta V$), which then is converted into data bits by read channel electronics.

A need exists for effective mechanism for implement enhanced STO sensing to achieve enhanced performance, enabling scaling to smaller sizes. It is desirable to provide such mechanism to allow for efficient and effective detection operation.

SUMMARY OF THE INVENTION

Aspects of the present invention are to provide a method, apparatus, and system for implementing spin-torque oscillator sensing with a demodulator for hard disk drives. Other important aspects of the present invention are to provide such method, apparatus, and system substantially without negative effect and to overcome some of the disadvantages of prior art arrangements.

In brief, a method, apparatus, and system for implementing spin-torque oscillator sensing with a demodulator for hard disk drives. The demodulator measures an instantaneous phase of the readback signal from a STO and converts the readback signal into a signal that is directly proportional to captured flux affecting the STO frequency during a bit time. The converted signal is used for processing by conventional data detection electronics.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the embodiments of the invention, methods, apparatus, and systems for implementing spin-torque oscillator (STO) sensing for hard disk drives (HDDs) are provided with an enhanced demodulator; an enhanced delay control feedback circuit; and a preamplifier and integrated demodulator.

Figure 1:
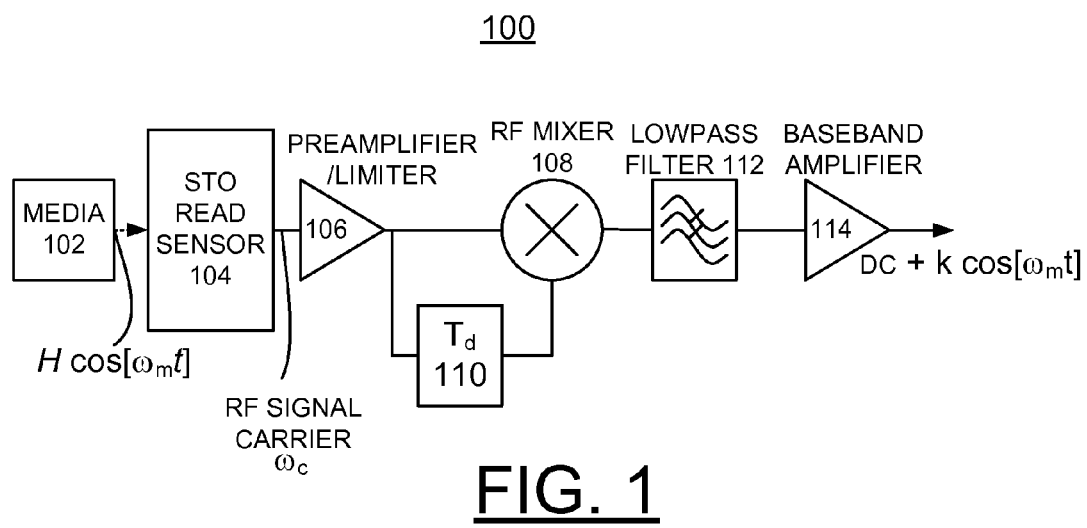
FIG. 1 is a block diagram representation illustrating a system for implementing spin-torque oscillator sensing with a demodulator including a delay control circuit for hard disk drives (HDDs)

Having reference now to the drawings, in FIG. 1, there is shown a system for implementing spin-torque oscillator sensing methods for hard disk drives (HDDs) generally designated by the reference character 100. STO system 100 is a delay line detector for providing a converted or detector output signal used for processing by conventional data detection electronics. STO system 100 includes a media 102 providing a magnetic signal indicated by H cos $[\omega_m t]$ received by a spin-torque oscillator (STO) read sensor 104.

In FIG. 1, the readback signal from media 102 sensed by the STO read sensor 104 is a sinusoidal oscillation with frequency related to the strength of the detected magnetic signal field. A conventional hard disk drive read channel detector is not able to instantaneously detect the STO oscillation frequency in the conventional manner, as required for accurate readback of a STO read sensor.

Several methods have been proposed for STO frequency detection, such as using a frequency filter to decrease/increase signal transmission based on the STO frequency, or by monitoring a change in STO signal amplitude, frequency, or phase using a detection system based in the frequency domain, such as a spectrum analyzer. However, real time detection requires operating in the time domain, similar to what is done in either radio amplitude modulation (AM) or frequency modulation (FM).

STO system 100 includes a preamplifier and limiter 106 receiving a sinusoidal readback signal indicated by FM SIGNAL CARRIER $\omega_c$ from the STO read sensor 104 and providing an output coupled to a radio frequency (RF) mixer 108 and a time delay Td 110. The RF mixer 108 multiplies the sinusoidal readback signal with the output of the time delay Td 110 and provides a multiplied output applied to a lowpass filter 112. An output of lowpass filter 112 is applied to a baseband amplifier 114. The STO system 100 includes an output from the baseband amplifier 114 indicated by DC+k cos$[\omega_m t]$. The output portion k cos$[\omega_m t]$ of the STO system 100 contains the modulating signal generated by the media 102 at frequency $\omega_m$ whose amplitude is determined by the media field strength H, STO sensors dispersion $\Delta f$ and detector delay Td. The output portion DC of the STO system 100 contains a DC signal whose value is determined by the carrier frequency FM SIGNAL CARRIER $\omega_c$ and detector delay Td.

Figure 2:
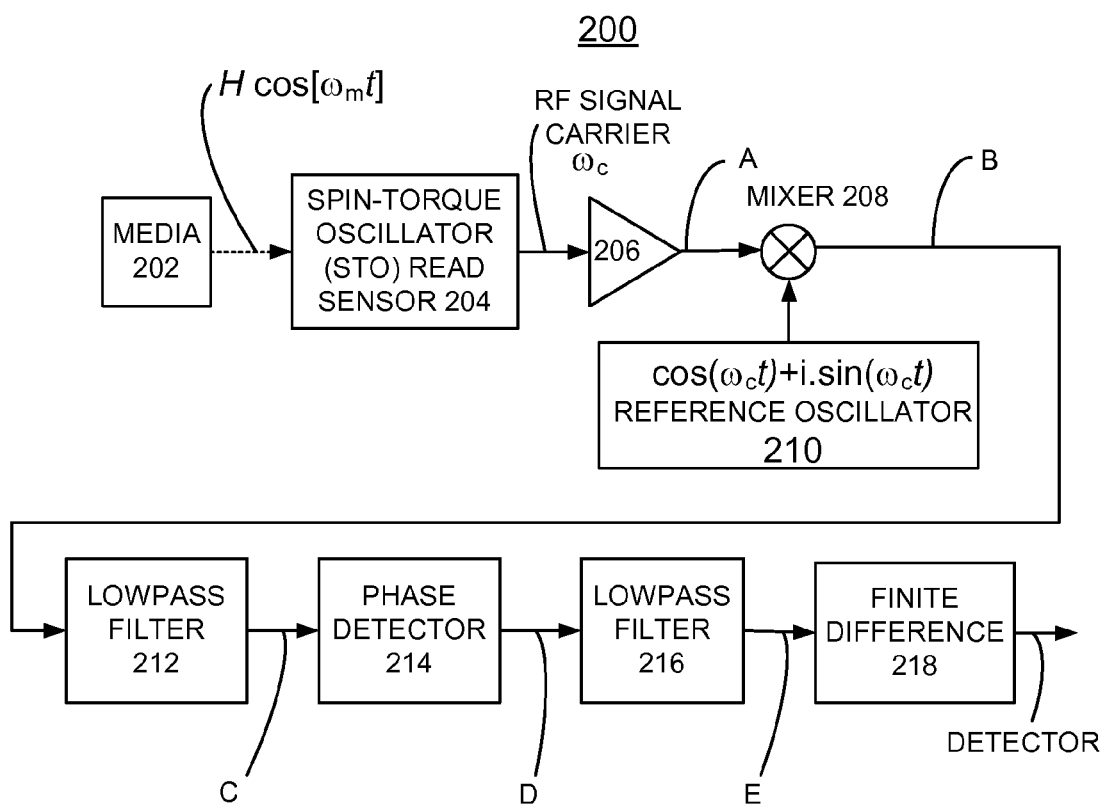
FIG. 2 is a block diagram representation illustrating a system for implementing spin-torque oscillator sensing with a demodulator including a Heterodyne phase detector circuit for hard disk drives (HDDs) in accordance with an embodiment of the invention.

Referring to FIG. 2, there is shown a practical implementation of a detection system for implementing spin-torque oscillator sensing with an FM demodulator for hard disk drives (HDDs) generally designated by the reference character 200 in accordance with an embodiment of the invention.

In accordance with features of the embodiments of the invention, STO frequency detection of STO system 200 involves the use of an FM demodulating circuit that converts the readback signal from the STO into a signal that is proportional to the magnetic signal field strength detected by the STO. STO system 200 advantageously includes the demodulator implemented by a Heterodyne phase detector circuit in accordance with a preferred embodiment of the invention.

In the heterodyne phase detection of STO system 200, the STO signal of interest at some frequency is mixed with a reference local oscillator (LO) that is set at carrier frequency ($\omega_c$). The desired outcome is the difference frequency, which carries phase, amplitude and frequency modulation information of the original higher frequency signal, oscillating at a lower more easily processed frequency.

STO system 200 includes a media 202 providing a magnetic signal indicated by H cos$[\omega_m t]$ received by a spin-torque oscillator (STO) read sensor 204. STO system 200 includes an amplifier 206 receiving a sinusoidal readback signal indicated by FM SIGNAL CARRIER $\omega_c$ from the STO read sensor 204.

In STO system 200 the signal flux entering the STO read sensor 204 changes the frequency of precession of the free layer. As the free layer precesses the angle between the free layer and the reference layer of the STO read sensor 204 changes resulting in a sinusoidal readback signal. The instantaneous frequency of this sinusoid is equal to the natural frequency of oscillation of the STO read sensor 204 plus a deviation term which is proportional to the signal flux. Additionally, the combination of STO phase noise plus Johnson and preamp (white) noise perturbs the frequency and phase of the readback signal at the input to a mixer 208 indicated at a point A.

The mixer 208 multiplies the STO output signal (plus noise) with an in-phase and quadrature output cos($\omega_c t$), and i.sin($\omega_c t$) of a local quadrature reference oscillator 210. The frequency $\omega_c$ of this reference oscillator 210 is the same as the natural frequency of oscillation of the STO 204. The mixer 208 is placed as close to the STO read sensor 204 as possible. In general this mixer 208 will be incorporated into the arm electronics (AE) module; however, in some applications, it may be possible to integrate the mixer directly with the STO 204 on a slider body (not shown). At the output of the mixer 208 indicated at a point B, the modulated STO signal has been converted into a complex baseband signal comprising in-phase and quadrature components.

STO system 200 includes a first lowpass filter 212, a phase detector 214 coupled between the first lowpass filter 212 and a second lowpass filter 216, and a finite difference function 218 providing the detector output. The lowpass filters 212, 216 are provided to eliminate signals and/or noise outside a band of interest and in general are implemented both at the output of the mixer 208 indicated at the point B and again in an analog front-end of the disk drive system-on-a-chip (SOC) integrated circuit indicated at a point E. In the preferred embodiment the phase detector 214 is implemented in the disk drive SOC integrated circuit but it could be integrated with the mixer 208 in the AE module.

In STO system 200 the phase detector 214 computes the instantaneous or unwrapped phase angle of the complex baseband signal. The resulting signal is low-pass filtered by the second lowpass filter 216 down to the bandwidth of the magnetic signal field from the media and/or that part of its bandwidth required for conventional magnetic recording read channel electronics. The difference between the filtered angle at the beginning and end of a bit time yields a readback signal proportional to the average signal flux affecting the STO frequency during the bit time identified by the finite difference function 218. This detector output value is then equalized and processed in the usual way to be converted into data bits by the read channel electronics. The output of the phase detector indicated at a point D can optionally be band-pass filtered to reduce the dynamic range requirements of the STO system 200, and the associated read channel electronics.

Figure 3:
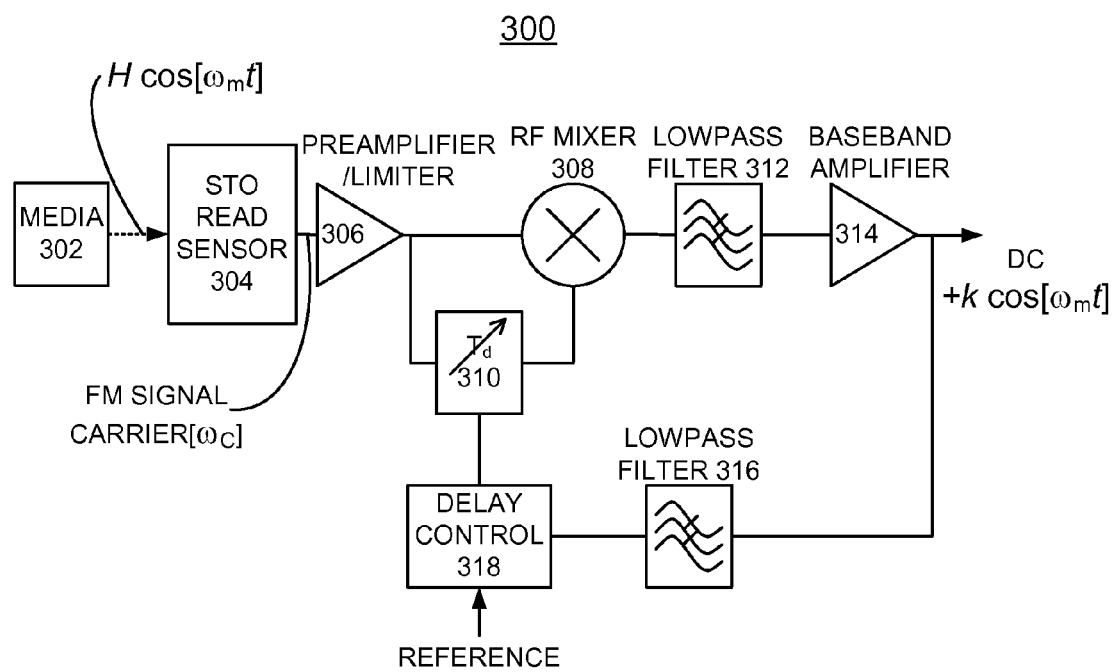
FIG. 3 is a block diagram representation illustrating the system for implementing spin-torque oscillator sensing with a delay control feedback circuit for hard disk drives (HDDs) in accordance with an embodiment of the invention.

Referring now to FIG. 3, there is shown a system for implementing spin-torque oscillator sensing with a delay control feedback circuit for hard disk drives (HDDs) generally designated by the reference character 300 in accordance with another preferred embodiment of the invention. STO system 300 includes a media 302 providing a magnetic signal indicated by H cos[$\omega_m$t] received by a spin-torque oscillator (STO) read sensor 304.

STO system 300 implements enhanced detector performance by zeroing of a DC output portion of the STO system 300 in accordance with the invention. Presence of a DC output portion of a STO system can be problematic. A large DC offset at the output of a STO system can degrade detector sensitivity and also could limit the usable input dynamic range of subsequent circuit blocks, such as in the associated read channel electronics. The DC offset at the output of a STO system can be zeroed out with proper choice of the detector delay, such as detector delay Td 110 in STO system 100 of FIG. 1.

However, in a STO system the exact carrier frequency may not be known in advance or some level of robustness is needed for mass production. For example, a need exist for implementing zeroing of the DC output due to the signal carrier frequency FM SIGNAL CARRIER $\omega_c$.

STO system 300 includes a preamplifier and limiter 306 receiving a sinusoidal readback signal indicated by FM SIGNAL CARRIER $\omega_c$ from the STO read sensor 304 and providing an output coupled to a radio frequency (RF) mixer 308 and an adjustable time delay Td 310. The RF mixer 308 multiplies the sinusoidal readback signal with the output of the adjustable time delay Td 310 and provides a multiplied output applied to a lowpass filter 312. An output of lowpass filter 312 is applied to a baseband amplifier 314. STO system 300 includes an output of the baseband amplifier 314 indicated by DC+k cos[$\omega_m$t].

In accordance with a preferred embodiment of the invention, STO system 300 monitors the DC output portion DC of the STO system 300 and uses feedback to adjust a detector delay Td 310 to null the signal carrier frequency FM SIGNAL CARRIER $\omega_c$. STO system 300 includes a lowpass filter 316 coupled to the output from the baseband amplifier 314 and providing an input to a delay control 318. In the feedback loop, the delay control 318 provides an input for adjustment of the adjustable time delay Td 310 to null the signal carrier frequency $\omega_c$ providing the modulating signal biased at zero or an other selected DC level appropriate for the subsequent circuit blocks, for example, in the associated read channel electronics.

Adjustment of the adjustable delay Td 310 can be made, for example, by physically switching in different delay lines, or by switching in different value capacitors in an LC tank circuit, such as with an integrated circuit (IC) implementation for the delay control feedback of STO system 300.

Figure 4:
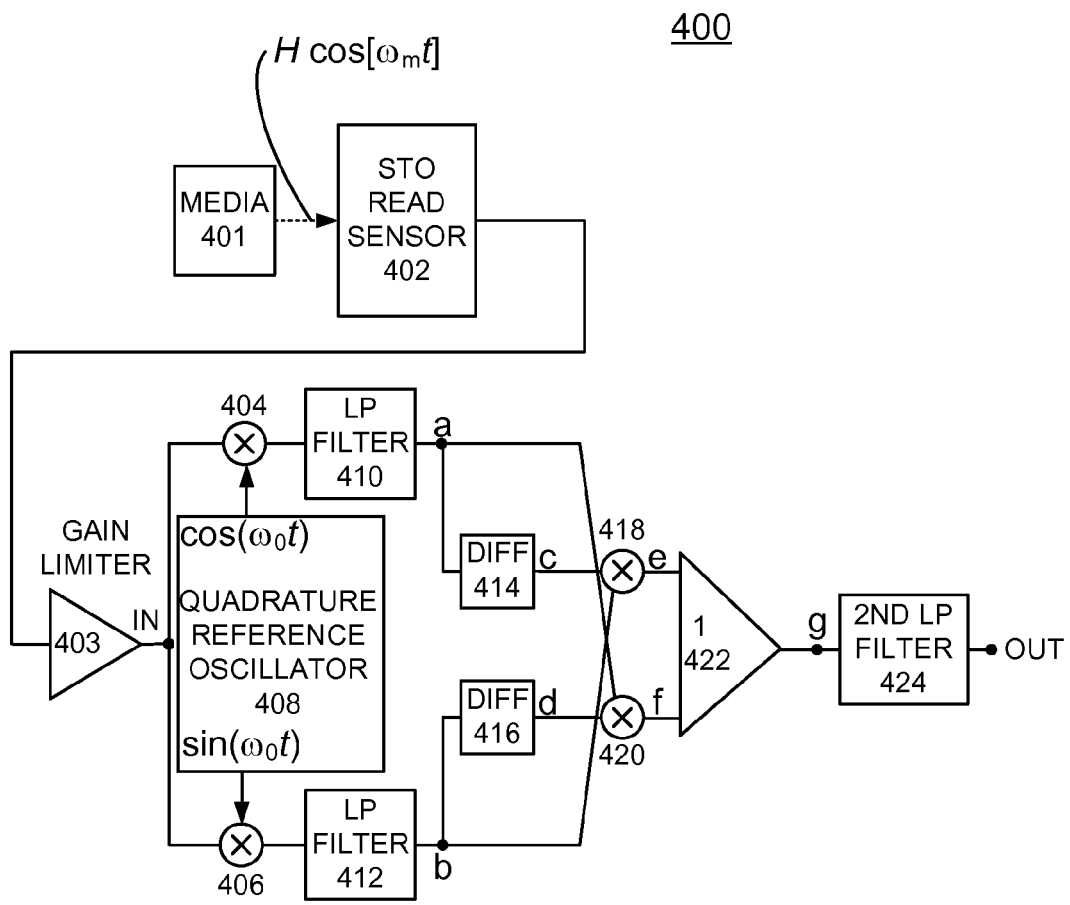
FIG. 4 is a block diagram representation illustrating a system for implementing magnetic recording sensing with a preamplifier and an integrated demodulator including a local quadrature oscillator for hard disk drives (HDDs) in accordance with embodiments of the invention.

Referring to FIG. 4, there is shown a STO system for implementing for spin-torque oscillator sensing for hard disk drives (HDDs) with a preamplifier and an integrated demodulator generally designated by the reference character 500 in accordance with an embodiment of the invention. STO system 400 includes a media 401 providing a magnetic signal indicated by H cos[$\omega_m$t] received by a spin-torque oscillator (STO) read sensor 402.

STO system 400 illustrates the basic concept of the integrated detection demodulator including the gain limiter 403 providing input indicated by IN applied to a pair of mixers 404, 406, respectively receiving an input cos($\omega_o$t), and an input sin($\omega_o$t) of a quadrature reference oscillator 408.

In the STO system 400, the raw signal from a spin-torque oscillator (STO) is presumed to have an idealized functional form characterized by the function A(t)cos($\omega$(t)t+$\phi$), where both amplitude A(t) and frequency $\omega$(t) may vary in time. Ideally, the amplitude A(t) would be constant, and only the frequency $\omega$(t) would vary in time due to the response of the STO read sensor to the applied signal field. However, fluctuations in amplitude A(t) may in practice be further compensated using a combined front-end preamplifier and limiter circuit. For simplicity, this part of the circuit is assumed to produce the resultant signal IN with unit amplitude, where input IN represents cos($\omega$(t)t+$\phi$), with a fixed unit amplitude, which serves as the input to the remainder of the detection circuit of STO system 400 of the invention.

In accordance with features of the detection circuit of STO system 400 of the invention, an analog output signal is produced which scales linearly with the amplitude of the external signal field. Since the oscillator frequency of the idealized STO scales linearly with the signal field, the desired output of STO system 400 is an output signal proportional to frequency $\omega$(t).

The quadrature reference oscillator 408 can be made from a single oscillator with a single oscillator with split output, one half of which is passed through a 90-degree phase shifter. The frequency $\omega_o$ of the quadrature reference oscillator 408 is approximately that of the STO in its quiescent bias state in the absence of an external signal field. Using the pair of mixers 404, 406, both quadrature components cos($\omega_o$t), and sin($\omega_o$ t) of the quadrature reference oscillator 412 are mixed with the input signal to form signals at the sum and difference frequencies, $\omega \pm \omega_o$. The output of respective mixers 404, 406 is low-pass filtered by a respective lowpass filter 410, 412 to remove the sum frequency components. Hence at points labeled a, and b of the STO system 400, ideally two signals result as represented by:

$$IN = \cos(\omega t + \phi), \ a(t) = \cos((\omega - \omega_o)t + \phi), \text{ and } b(t) = -\sin((\omega - \omega_o)t + \phi) \quad \text{Eq. (1)}$$

The one-sided bandwidth of the first lowpass filters 410, 412 is chosen to accommodate the maximum frequency shift that the STO will undergo as a result of exposure to the largest expected signal fields. For example, for a maximum STO frequency shift of $\Delta f \sim 2$ GHz, a practical choice for low-pass filter (410, 412) bandwidth would be approximately BW$\approx$2-3 GHz, which is similarly the bandwidth of the signals at points a and b.

The signals a(t), b(t) are differentiated by a respective differentiation (or finite difference) circuit element DIFF 414, 416, providing two resulting signals as represented by:

$$c(t) = da/dt = -(\omega - \omega o)\sin((\omega - \omega_o)t + \phi), \text{ and } d(t) = db/dt = -(\omega - \omega_o)\cos((\omega - \omega_o)t + \phi) \quad \text{Eq. (2)}$$

In practice, the circuit elements DIFF 414, 416 may be designed from differencing circuits employing finite time delay lines, for example, c(t)~a(t)−a(t−$\Delta$t). A delay time $\Delta t \cong 1/(4 \text{ BW})$ is sufficient to perform an effective differentiation with sufficient fidelity, but lower the overall boost in electronics noise as compared to a true differentiation of existing noise in the STO system 400.

The signals c(t) is mixed with the signal b(t) and similarly signals d(t) is mixed with the signal a(t) by a respective mixer 418, 420, providing two resulting signals e(t) and f(t) as represented by:

$$e(t) = b(t) \times c(t) = (\omega - \omega_o)\sin^2((\omega - \omega_o)t + \phi), \text{ and}$$

$$f(t) = a(t) \times d(t) = -(\omega - \omega_o)\cos^2((\omega - \omega_o)t + \phi) \quad \text{Eq. (3)}$$

It should be understood that additional delay lines for example, for the circuit paths of signals a(t) and d(t) could be provided to a second set of mixers to adjust, if needed, the relative phases of these signals with those of b(t) and c(t) which also pass through the delay lines associated with the differentiation circuitry.

Finally signals e(t) and f(t) are fed into a differential amplifier 422, for example, having a unity gain to form a signal g(t). The signal g(t) is essentially the desired output of the STO system 400, which scales linearly with ω(t) of the STO read sensor. For example, the zero of detector output approximately occurs when the STO read sensor is in its quiescent state, oscillating continuously at frequency $\omega_o$. STO system 400 preferentially includes a second lowpass filter 424 lowpass filtering the output of the differential amplifier 422 and providing the detector output indicated by OUT.

For example, the bandwidth of g(t) can be as large as BW≈3 GHz, with Δf perhaps as large as roughly 2 GHz for a possible STO read sensor. This is true regardless of the frequency bandwidth of the signal fields which modulate the STO's oscillation frequency. Due to increase electronic noise resulting from the differentiation circuit elements DIFF 414, 416, even when operated in the difference mode, it is likely desirable to limit the overall bandwidth BW' of the OUT signal necessary for adequate processing of this output signal by the read channel electronics. For example, with BW'≤1-2 GHz in a HDD, the second loss pass filter 424 would be chosen to have a one-sided bandwidth of approximately BW'.

While the present invention has been described with reference to the details of the embodiments of the invention shown in the drawing, these details are not intended to limit the scope of the invention as claimed in the appended claims.

What is claimed is:

1. A method for implementing data detection with spin-torque oscillator (STO) sensing with a demodulator for hard disk drives comprising:
   receiving an input signal from a STO read sensor having an oscillation frequency ω(t) related to magnetic field varying in time in response to a varying applied magnetic field;
   providing a mixer for mixing said readback signal with a quadrature reference frequency signal producing a complex baseband readback signal; said quadrature reference frequency signal having a frequency approximately equal to said STO read sensor in a quiescent bias state;
   providing a phase detector for measuring an instantaneous phase of said complex baseband a readback signal from said STO read sensor; and
   providing a finite difference function coupled to said phase detector converting said processed readback signal into a converted signal proportional to the magnetic field affecting frequency of said STO read sensor during a bit time; said converted signal being used for processing by data detection electronics.

2. The method for implementing STO sensing as recited in claim 1 includes mixing said readback signal with said quadrature reference frequency signal including quadrature reference frequency components represented by $\cos(\omega_c t)$, and $i.\sin(\omega_c t)$.

3. The method for implementing STO sensing as recited in claim 1 includes providing a mixer for mixing said readback signal with said quadrature reference frequency signal being positioned proximate to said STO read sensor.

4. The method for implementing STO sensing as recited in claim 3 includes providing a lowpass filter coupled to said mixer, said mixer producing said complex baseband signal comprising in-phase and quadrature components, and said lowpass filter lowpass filtering said complex baseband signal.

5. The method for implementing STO sensing as recited in claim 4 includes providing said phase detector coupled to said lowpass filter.

6. The method for implementing STO sensing as recited in claim 1 wherein converting said readback signal into said converted signal includes providing a lowpass filter coupled to said phase detector and lowpass filtering a resulting signal from said phase detector.

7. The method for implementing STO sensing as recited in claim 6 includes providing said finite difference function coupled to said lowpass filter for yielding said converted signal proportional to captured flux affecting said STO frequency during said bit time.

8. An apparatus for implementing data detection with spin-torque oscillator (STO) sensing for hard disk drives comprising:
   a spin-torque oscillator (STO) read sensor sensing a signal magnetic field and producing a readback signal;
   a mixer coupled to a quadrature reference oscillator mixing said readback signal from said STO read sensor with a quadrature reference frequency signal producing a complex baseband readback signal; said quadrature reference frequency signal having a frequency approximately equal to said STO read sensor in a quiescent bias state;
   a lowpass filter receiving and lowpass filtering said complex baseband readback signal;
   a frequency modulation (FM) demodulator including
   a phase detector coupled to said lowpass filter measuring an instantaneous phase of said filtered complex baseband readback signal;
   a second lowpass filter coupled to said phase detector and lowpass filtering a resulting signal from said phase detector; and
   a finite difference function coupled to said second lowpass filter converting the filtered complex baseband readback signal into a signal that is proportional to captured flux affecting the STO frequency during a bit time; the converted signal being used for processing by data detection electronics.

9. The apparatus for implementing data detection as recited in claim 8 includes said mixer mixing said readback signal from said STO read sensor with a quadrature reference frequency signal including quadrature reference frequency components represented by $\cos(\omega_c t)$, and $i.\sin(\omega_c t)$.

10. The apparatus for implementing data detection as recited in claim 8 includes said mixer producing said complex baseband signal comprising in-phase and quadrature components, and said mixer being positioned proximate to said STO read sensor.

11. The apparatus for implementing data detection as recited in claim 8 includes an amplifier coupled to said STO read sensor amplifying said readback signal.

12. The apparatus for implementing data detection as recited in claim 11 wherein said mixer receiving said amplified readback signal from said amplifier.

13. A system for implementing data detection with spin-torque oscillator (STO) sensing for hard disk drives comprising:
   a magnetic signal having an amplitude determined by media field strength;
   a spin-torque oscillator (STO) read sensor sensing said magnetic signal generated by said media and producing a readback signal;
   a mixer coupled to a quadrature reference oscillator mixing said readback signal from said STO read sensor with a quadrature reference frequency signal producing a complex baseband readback signal; said quadrature reference frequency signal having a frequency approximately equal to said STO read sensor in a quiescent bias state;

a lowpass filter receiving and lowpass filtering said complex baseband readback signal;

a frequency modulation (FM) demodulator including a phase detector coupled to said lowpass filter measuring an instantaneous phase of said filtered complex baseband readback signal;

a second lowpass filter coupled to said phase detector and lowpass filtering a resulting signal from said phase detector; and a finite difference function coupled to said second lowpass filter converting the filtered complex baseband readback signal into a signal that is proportional to captured flux affecting the STO frequency during a bit time; the converted signal being used for processing by data detection electronics.

14. The system for implementing data detection as recited in claim 13 includes said mixer mixing said readback signal from said STO read sensor with said quadrature reference frequency signal including quadrature reference frequency components represented by $\cos(\omega_c t)$, and $i.\sin(\omega_c t)$.

* * * * *